United States Patent [19]

Burkhardt et al.

[11] Patent Number: 5,118,742

[45] Date of Patent: Jun. 2, 1992

[54] BLEND OF SILICATE AND PHOTOCURABLE ARYLSILOXANE MATERIALS

[75] Inventors: Eric W. Burkhardt, Brewster; John H. Deatcher, Lake Peekskill, both of N.Y.; Robert Burford, Templestowe, Australia

[73] Assignee: Akzo NV, Arnhem, Netherlands

[21] Appl. No.: 504,148

[22] Filed: Apr. 3, 1990

Related U.S. Application Data

[63] Continuation-in-part of Ser. No. 342,150, Apr. 24, 1989, Pat. No. 5,089,303.

[51] Int. Cl.⁵ .................................................. C08K 5/54
[52] U.S. Cl. ......................................... 524/266; 524/261; 524/264; 524/588; 427/387
[58] Field of Search ............... 524/266, 261, 588, 264; 427/387; 556/483, 489, 458

[56] References Cited

U.S. PATENT DOCUMENTS

| | | | |
|---|---|---|---|
| 2,717,242 | 9/1955 | Foehr | 556/483 |
| 3,342,898 | 9/1967 | Roselli | 556/483 |
| 3,463,802 | 8/1969 | Blake et al. | 556/483 |
| 3,491,134 | 1/1970 | Seil et al. | 556/483 |
| 3,529,008 | 9/1970 | Brandeis et al. | 556/483 |
| 3,706,695 | 12/1972 | Huebner et al. | 524/261 |
| 4,349,609 | 9/1982 | Takeda et al. | 428/429 |
| 4,600,685 | 7/1986 | Kitakohji et al. | 430/313 |
| 4,758,620 | 7/1988 | Whitwell et al. | 524/588 |
| 4,801,507 | 1/1989 | Estes et al. | 528/39 |
| 4,835,298 | 5/1989 | Terbot et al. | 556/483 |
| 4,904,721 | 2/1990 | Hanaoka et al. | 524/377 |

FOREIGN PATENT DOCUMENTS

| | | |
|---|---|---|
| 0314313 | 5/1989 | European Pat. Off. |
| 63-270774 | 11/1988 | Japan |
| 01-165652 | 6/1989 | Japan |
| 63-270762 | 11/1989 | Japan |
| 1156857 | 5/0000 | U.S.S.R. |

OTHER PUBLICATIONS

Hackh's Chemical Dictionary–p. 610 (1969).

*Primary Examiner*—Veronica P. Hoke
*Attorney, Agent, or Firm*—Richard P. Fennelly; Louis A. Morris

[57] ABSTRACT

Good quality films can be formed on a substrate by coating a substrate with a solution comprising a liquid silicate solvent containing a dissolved photocurable arylsiloxane oligomer or polymer. Phenyl silocane/silicate compositions can be used to form photocurable films on substrates for use as dielectric films, protective coatings, and the like.

8 Claims, No Drawings

BLEND OF SILICATE AND PHOTOCURABLE ARYLSILOXANE MATERIALS

This is a continuation-in-part of U.S. Ser. No. 342,150, filed Apr. 24, 1989, now U.S. Pat. No. 5,089,303 issued Feb. 18, 1992.

BACKGROUND OF THE PRESENT INVENTION

The present invention is directed to a solution formed by mixing a silicate solvent and a photocurable arylsiloxane material dissolved therein which can be used, as a spin-on-solution, for example, to form striation-free films having good reflectivity characteristics. Photocurable arylsiloxane materials, suitable for use as interlayer dielectric films, which can be spin coated are known to persons of ordinary skill in the art. For example, U.S. Pat. No. 4,349,609 to S. Takeda et al. mentions the use of a variety of organic solvents for such arylsiloxane materials, including a mixture of cyclohexanone and toluene, a mixture of n-butyl cellosolve acetate and toluene, a mixture of isophorone and toluene, metacresol, and a mixture of N-methyl-2 pyrrolidone and N,N-dimethylacetamide. Various of these enumerated solvents are either corrosive, are teratogenic, are carcinogenic, or are irritants. More recent U.S. Pat. No. 4,600,685 to T. Kitakohji et al. also indicates the spin-coating of organosiloxane resins to form interlayer dielectric films. This reference mentions such organic solvents as toluene, cyclohexane, methyl cellosolve acetate (a suspected teratogen), alcohols, and ketones. Example 4 illustrates a mixed solvent of monobutylcellosolve acetate and toluene.

Another example of a recent U.S. patent which describes the spin-coating of arylsiloxane oligomers and polymers dissolved in organic solvents to form interlayer dielectric films is U.S. Pat. No. 4,663,414 to W. E. Estes et al. which indicates the use of xylene as a preferred aromatic hydrocarbon as the solvent. This patent indicates that toluene and benzyl alcohol are less preferred solvents for use in the spin-coating procedure.

More recently, in U.S. Ser. No. 342,150, filed Apr. 24, 1989, blends of alkoxyalkanol solvents and photocurable arylsiloxane materials have been described.

All of the approaches previously mentioned rely upon the use of a relatively volatile organic solvent to dissolve the arylsiloxane material. The use of such a relatively volatile solvent component has certain shortcomings including: the production of formulations which have a lower degree of viscosity than desired due to the need to have enough solvent present to maintain spinability for the liquid formulation; the possible production of pinholes in the film that is produced due to the evaporation of residual organic solvent; and the problems associated with human exposure to the volatile organic solvent during the process of film formation.

It is known to use ethyl silicate as a solvent with a narrowly defined hydrophobic organosilicon "fluid" which is described as containing silica, tetraethoxysilane and oligomers formed as a result of partial hydrolytic polycondensation of the latter (see U.S.S.R. Patent No. 1,156,857). The resulting composition is indicated as being useful in coating a porous article with the ethyl silicate being identified as guaranteeing a more complete filing of the pores of the article. This reference does not suggest that solid siloxane materials can be dissolved in ethyl silicate nor does it suggest selection of a photocurable arylsiloxane oligomer or polymer as the organosilicon component.

SUMMARY OF THE PRESENT INVENTION

The present invention relates to the discovery that arylsiloxane oligomers or polymers, e.g., solid oligomers or polymers, can be dissolved in a liquid silicate to yield a clear, photocurable solution which, when used in a coating procedure, e.g., a spin-coating procedure, gives striation-free photocurable films of superior thickness, for example, to those shown in U.S. Pat. No. 4,758,620, that do not have reduced reflectivity.

DETAILED DESCRIPTION OF THE PRESENT INVENTION

As will be appreciated by a person of ordinary skill in the art, it is most desired that films spun coated from any solvent medium be substantially free of a rippled (or striated) surface, have no substantial reduction in their reflectivity, and also be generated from substantially clear solutions. The reasons for such requirements in the case of interlayer dielectric films are improved coverage of underlying features, a substantially planar surface for deposition of subsequent interconnect layers, and improved behavior in photolithographic imaging and processing. These are all highly desirable for the production of high density VLSICs.

In accordance with the present invention, photocurable arylsiloxane oligomers and polymers can be dissolved in a relatively nonvolatile liquid silicate solvent (as compared to such volatile organic solvents as ethanol, acetone, etc.) to yield the desired clear solutions which can result in the production of substantially non-striated films that do not have any substantial reduction in their reflectivity when the solutions are used in a spin-coating procedure to form interlayer dielectric films. The use of relatively nonvolatile silicates as the solvent medium allows for higher viscosity formulations which are still spinnable, reduces the likelihood of pinhole formation in the resulting film after curing, and reduces the likelihood of human exposure to solvent vapors. The instant invention also allows formation of thicker films (e.g., in excess of about ten microns) as compared to previous developments using volatile organic solvents (e.g., up to about three microns). Representative types of arylsiloxane polymers that can be dissolved in the solvent component described in connection with the present invention are well-known to persons of ordinary skill in the art and include the types of organosiloxane resins described in U.S. Pat. Nos. 4,349,609 and 4,600,685, referred to above, each of which is incorporated herein by reference.

More recent U.S. Pat. No. 4,663,414 to W. E. Estes, which is also incorporated herein by reference, describes another type of organosiloxane material which yields phospho-boro-silanol interlayer dielectric films and which can be used in a spin-coating procedure.

Yet another type of organosiloxane oligomer or polymeric composition which can be used in conjunction with the present invention is described in U.S. Pat. No. 4,801,507 which is incorporated herein by reference. The latter type of siloxane/silicate compositions are formed by the cohydrolyzation and cocondensation of an aryl group-containing trifunctional silanetriol, or derivative thereof, with a tetrafunctional silicic acid compound. For example, cohydrolyzed/condensed materials formed by the reaction of phenyl silanetriol and a tetraalkyl silicate, such as, tetraethyl silicate, are preferred materials in accordance with the above-mentioned patent.

The liquid silicate compounds which can be used as the substantially nonvolatile solvent component in accordance with the present invention are of the formula $$R'_x-Si-(OR)_{4-x}$$

where R' can be selected from the group consisting of lower alkyl and phenyl and x can be 0 to 3. Representative R groups include alkyl such as ethyl. Representative silicates include tetraethylorthosilicate, triethoxyvinylsilane, and triethoxyphenylsilane.

It is within the contemplation of the instant invention to form photocurable compositions which comprise an arylsiloxane component at from about 5% to about 60%, by weight of the entire composition, and the liquid silicate solvent at from about 40% to about 95%, by weight. When the arylsiloxane/silicate materials of U.S. Pat. No. 4,801,507 are used (which is preferred) the weight ratio of aryl group-containing trifunctional silanetriol (or derivative used in forming such materials) will range from about 10:1 to about 3:1 based on the weight of tetrafunctional silicic acid compound (e.g., tetraalkyl silicate).

The aryl siloxane/silicate materials of U.S. Pat. No. 4,801,507 are capable of being developed in either a positive or negative way when photomasked, photolyzed, and then appropriately treated. For example, the photolyzed portion is not soluble in most common organic solvents (e.g., acetone, isopropanol, etc.) allowing for such solvents to wash away the masked portions to produce a negative image. If a positive image is desired, hydrogen fluoride can be used to treat the photolyzed portion leaving the masked portions intact.

Another embodiment of the present invention involves more than the deposit of non-conductive, dielectric films in electronic devices. It involves the coating of a desired substrate with a protective film having certain desirable properties.

One embodiment of the instant invention involves the placement of a protective coating on an optical glass substrate (e.g., the placement of such a protective coating on eyeglass lenses to prevent their scratching when used). Such a coating can be photocured (due to the presence of a photocurable phenyl siloxane moiety) at relatively low temperature with no attendant heat curing and distortion of the shape of the underlying lens material. The coating will be hard enough to have scratch resistance but be organic (phenyl-group containing) enough in character to be photocurable. The system is compatible with such organic dyes as [29 H, 31H-phthalocyaminato(2-)-N$^{29}$, N$^{30}$, N$^{31}$, N$^{32}$]-copper (Irgalite Blue LGLD brand from Ciga-Geigy) and 3,3¹-(1,4-phenylenediimino)bis[4,5,6,7-tetrachloro-1H-Isoindol-1-one] (Irgazin Yellow 3 RLT brand from Ciba-Geigy) thereby allowing for the production of films on optical substrates which are tinted.

Other substrates can also be coated with the instant compositions to achieve placement of protective coatings therein. Examples of such substrates include silicon wafers, aluminum oxide wafers, glass, polyimides, polyether ether ketone, carbon composites, graphite composites, and the like. For example, microcircuits can be hermetically sealed with the cured composition. Certain kinds of glasses which are sensitive to moisture and other forms of environmental degradation can also be coated with the compositions which would be photocured.

The photocurable compositions of the instant invention can be applied to a desired substrate by various means (e.g., spin coating, dip coating, spray coating, etc.).

If desired, the coating compositions of the present invention can be photolyzed before being spin coated. Such a step serves to initiate a condensation reaction in the solution yielding a more viscous coating composition which, when coated onto the desired substrate, results in a thicker film. Examples 4-6 below illustrate such a technique.

The Examples which follows further illustrate the instant invention.

EXAMPLE 1

A solution was prepared by dissolving 150 grams of Wacker brand solid phenylsiloxane resin (SY-430) into 100 grams of tetraethylorthosilicate (TEOS). The resulting solution possessed an SY-430 to TEOS weight ratio of 1.5. This solution was diluted with further addition of TEOS to yield the desired lower viscosity values as given in the Table below.

The Table below lists the viscosity values for various SY-430/TEOS weight ratios:

TABLE 1

| Weight Ratio SY-430/TEOS | Viscosity (cp) |
|---|---|
| 0.25 | 2 |
| 0.50 | 7 |
| 0.75 | 17 |
| 1.00 | 43 |
| 1.25 | 73 |
| 1.50 | 199 |

Using standard spin deposition techniques, the thickness of siloxane films was controlled by either altering the spinning speed (e.g., in the range of 1,000 to 10,000 rpm) or by altering the viscosity of the solution. Generally, films were prepared by spinning a solution at 2000 rpm for 60 seconds, followed by either a thermal or photolytic curing step. Thermal curing was achieved at temperatures up to 350° C. Photolytic curing was achieved by exposure to ultraviolet light from a medium pressure mercury lamp. Cured films with a thickness of up to 10 microns were obtained from solutions with an SY-430/TEOS ratio of 1.5.

The use of a photomask enabled the selective curing of regions of the film. After photocure, the film were developed in either a positive fashion by washing with buffered HF, or in a negative fashion by washing with an organic solvent such as xylene or methoxypropanol.

EXAMPLE 2

A solution was prepared similarly to Example 1 in which triethoxyvinylsilane (TEVS) was used instead of TEOS. This solution was also diluted with additional TEVS to yield the desired viscosity value. The Table below lists the measured viscosity at various SY-430/TEVS weight ratios:

TABLE 2

| Weight Ratio SY-430/TEVS | Viscosity (cp) |
|---|---|
| 0.25 | 2 |
| 0.50 | 6 |
| 0.75 | 16 |
| 1.00 | 32 |
| 1.25 | 68 |

TABLE 2-continued

| Weight Ratio SY-430 TEVS | Viscosity (cp) |
|---|---|
| 1:50 | 126 |

Using the conditions described in Example 1, film thicknesses up to 11 microns were obtained. Films obtained in this manner were also capable of photoimaging.

EXAMPLE 3

A solution was prepared similarly to Example 1 in which triethoxyphenylsilane (TEPS) was substituted for TEOS. This solution was further diluted with TEPS in order to yield viscosity values that were similar to those obtained in Example 1. Using the conditions described in Example 1, film thicknesses up to 12 microns were obtained. The films were also capable of photoimaging.

EXAMPLE 4

A solution of SY-430 in TEOS (weight ratio 1.25) yielded films of 3 micron thickness when spin deposited (2000 rpm) and thermally cured (350° C.). Photolysis of this solution for a period of 24 hours yielded films which were 11 microns in thickness. Photolysis for periods as short as one hour resulted in a solution which underwent gradual viscosity increases yielding films of gradually increasing thickness.

EXAMPLE 5

A solution of SY-430 in TEVS (weight ratio 1.25) yielded similar results (see Example 4) when photolyzed. Film thicknesses of 9 microns were obtained after photolysis for 20 hours. Short photolysis periods also resulted in solutions which increased in viscosity over time.

EXAMPLE 6

A solution of SY-430 in TEPS (weight ratio 1.25) yielded similar results (see Example 5) when photolyzed. Film thicknesses of 15 microns were obtained after photolysis for 16 hours. Short photolysis periods also resulted in solutions which increased in viscosity over time.

The foregoing Examples illustrate certain embodiments of the instant invention and should not, therefore, be construed in a limiting sense. The scope of protection sought is set forth in the claims which follow.

We claim:

1. A homogeneous liquid composition which comprises a liquid silicate of the formula $R'_x-Si-(OR)_{4-x}$, where $R'$ is selected from the group consisting of lower alkyl, phenyl and lower alkylvinyl and x is 0 to 3 containing from about 5% to about 60%, by weight of the composition, of a photocurable arylsiloxane oligomer or polymer dissolved therein.

2. A composition as claimed in claim 1 wherein the oligomer or polymer is a phospho-boro-silanol material.

3. A composition as claimed in claim 1 wherein the arylsiloxane oligomer or polymer is formed by cohydrolyzation and cocondensation of a silanetriol with a tetrafunctional silicic acid compound.

4. A composition as claimed in claim 3 wherein the silanetriol is phenyl silanetriol and the silicic acid compound is a tetraalkyl silicate.

5. A composition as claimed in claim 4 wherein the tetraalkyl silicate is tetraethylorthosilicate.

6. A composition as claimed in claim 1 wherein the liquid silicate has the formula $Si(OR)_4$ where R is lower alkyl.

7. A composition as claimed in claim 6 wherein the silicate is tetraethylorthosilicate.

8. A method of forming a coating on a substrate which comprises coating the substrate with the composition of any one of claims 1-7 and curing the composition.

* * * * *